(12) United States Patent
Kishimoto

(10) Patent No.: US 10,439,567 B2
(45) Date of Patent: Oct. 8, 2019

(54) SWITCHING POWER SUPPLY AND AMPLIFICATION DEVICE

(71) Applicant: Onkyo Corporation, Osaka (JP)

(72) Inventor: Atsunori Kishimoto, Osaka (JP)

(73) Assignee: Onkyo Corporation, Osaka (JP)

( * ) Notice: Subject to any disclaimer, the term of this patent is extended or adjusted under 35 U.S.C. 154(b) by 0 days.

(21) Appl. No.: 16/159,687

(22) Filed: Oct. 14, 2018

(65) Prior Publication Data

US 2019/0115882 A1 Apr. 18, 2019

(30) Foreign Application Priority Data

Oct. 18, 2017 (JP) .................................. 2017-201450

(51) Int. Cl.
| | |
|---|---|
| *H03F 3/04* | (2006.01) |
| *H03F 3/217* | (2006.01) |
| *H03F 1/30* | (2006.01) |
| *H03F 3/185* | (2006.01) |
| *H03F 3/08* | (2006.01) |
| *H02M 3/335* | (2006.01) |
| *H02M 1/00* | (2006.01) |

(52) U.S. Cl.
CPC ........ *H03F 3/217* (2013.01); *H02M 3/33507* (2013.01); *H03F 1/30* (2013.01); *H03F 3/08* (2013.01); *H03F 3/185* (2013.01); *H02M 2001/0006* (2013.01); *H03F 2200/03* (2013.01); *H03F 2200/31* (2013.01); *H03F 2200/504* (2013.01)

(58) Field of Classification Search
CPC .......... H03F 1/0211; H03F 3/04; H02M 1/14
USPC ............................................ 330/297; 363/41
See application file for complete search history.

(56) References Cited

U.S. PATENT DOCUMENTS

| | | | |
|---|---|---|---|
| 9,800,165 B2 | 10/2017 | Yamamoto | |
| 2015/0349651 A1* | 12/2015 | Morota | ............. H02M 3/33523 363/21.15 |

FOREIGN PATENT DOCUMENTS

JP 2017-139837 A 8/2017

* cited by examiner

*Primary Examiner* — Steven J Mottola
(74) *Attorney, Agent, or Firm* — Renner, Otto, Boisselle & Sklar, LLP

(57) ABSTRACT

A switching power supply comprising: a control circuit which is provided at a primary side and controls a switching element based on a value which is fed back from a secondary side; a transformer; a secondary side rectifier element which rectifies voltage which is supplied from the transformer; and a secondary side smooth element which smoothes voltage which is rectified by the rectifier element, wherein voltage which is smoothed by the smooth element is supplied to an amplifier and voltage which is smoothed by the smooth element is fed back to the control circuit, further comprising: a diode which is connected between the smooth element and the amplifier in series.

4 Claims, 2 Drawing Sheets

SWITCHING POWER SUPPLY AND AMPLIFICATION DEVICE

CROSS-REFERENCE TO RELATED APPLICATIONS

This application claims priority to Japanese Application No. 2017-201450, filed Oct. 18, 2017, the entire contents of which are incorporated herein by reference.

FIELD

The present invention relates to a switching power supply and an amplification device.

BACKGROUND

In a switching power supply (for example, see JP 2017-139837 A.), second side output voltage is fed back to a primary side control IC via a photo coupler. The control IC adjusts output voltage of the switching power supply by changing duty of ON/OFF by a switching element in accordance with the voltage of a feedback terminal.

Herein, in an amplification device which includes the switching power supply and an amplifier to which voltage from the switching power supply is supplied, to improve audio quality and so on by suppressing feedback amount to the control IC, gain is set to small. As a result, response characteristics deteriorate, and performance of the switching power supply deteriorates.

SUMMARY OF THE INVENTION

According to one aspect of the disclosure, there is provided a switching power supply comprising: a control circuit which is provided at a primary side and controls a switching element based on a value which is fed back from a secondary side; a transformer; a secondary side rectifier element which rectifies voltage which is supplied from the transformer; and a secondary side smooth element which smoothes voltage which is rectified by the rectifier element, wherein voltage which is smoothed by the smooth element is supplied to an amplifier and voltage which is smoothed by the smooth element is fed back to the control circuit, further comprising: a diode which is connected between the smooth element and the amplifier in series.

DETAILED DESCRIPTION OF THE PREFERRED EMBODIMENTS

An objective of the present invention is to suppress feedback amount from a secondary side to a primary side without deteriorating performance of a switching power supply.

An embodiment of the present invention is described below.

First Embodiment

Figure 1:
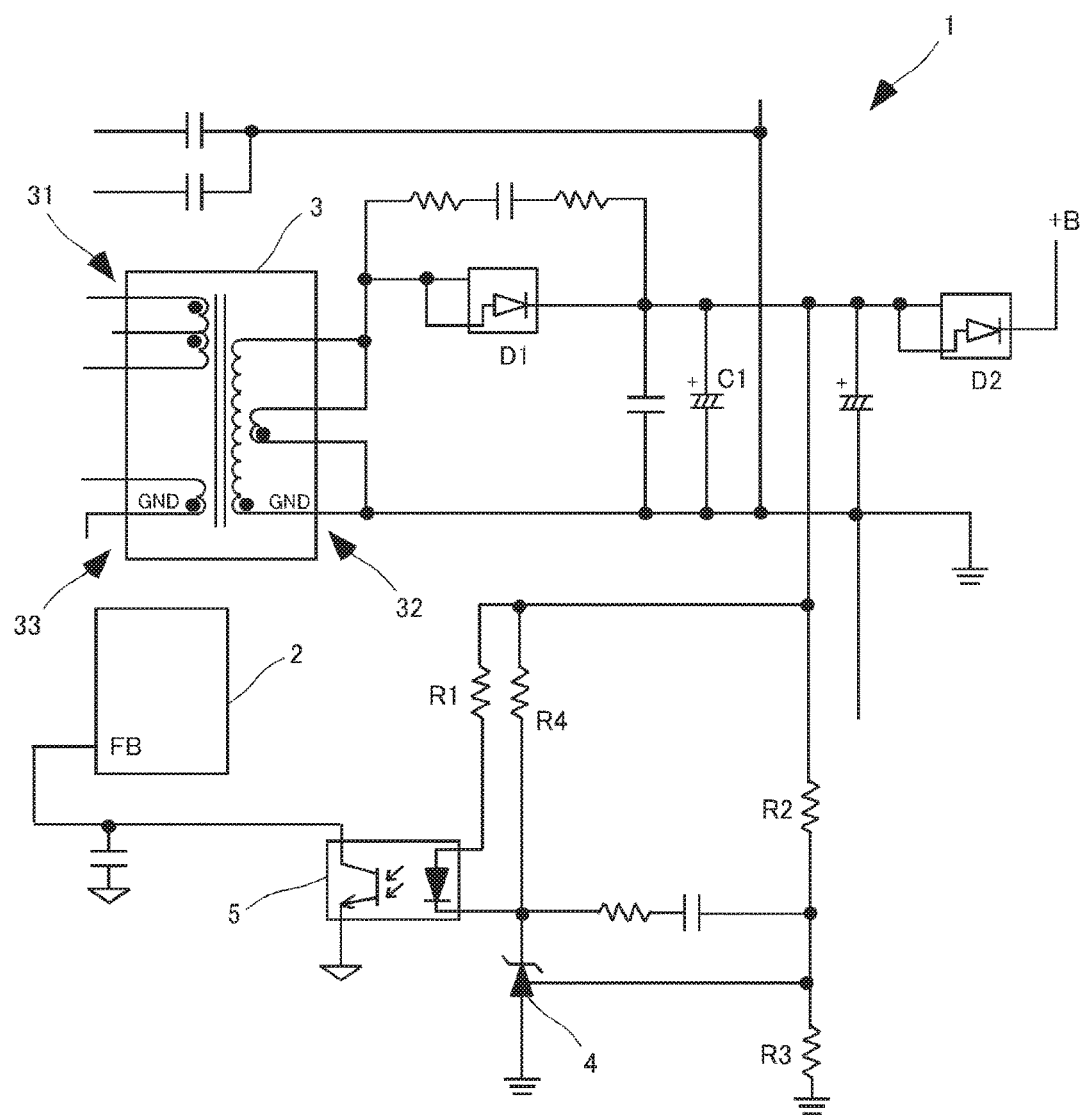
FIG. 1 is a diagram illustrating a circuit constitution of a switching power supply according to a first embodiment of the present disclosure.

FIG. 1 is a diagram illustrating a circuit constitution of a switching power supply according to a first embodiment of the present invention. The switching power supply 1 includes a primary side rectifier circuit, a primary side condenser for smooth, a switching element, a control IC 2, a transformer 3, a secondary side diode D1 for rectifier, a secondary side condenser C1 for smooth, a shunt regulator 4, a photo coupler 5, and a diode D2. The switching power supply 1 according to the first embodiment is a flyback system switching power supply.

The primary side rectifier circuit rectifies AC voltage which is input from an AC power supply. The primary side condenser smoothes voltage which is rectified by the rectifier circuit. Smoothed voltage is supplied to the switching element. The control IC 2 (control circuit) controls the switching element. A power supply terminal of the control IC 2 is connected to an auxiliary coil 33 of the transformer 3. The control IC 2 operates by power supply voltage that is the voltage output from the auxiliary coil 33 and rectified. The switching element is controlled by the control IC 2 and supplies optional frequency AC voltage to a primary side coil 31 of the transformer 3 by switching with optional frequency. The switching element is an n type MOSFET, for example. The switching element supplies voltage from the primary side condenser for smooth or voltage of ground potential to the primary coil 31.

The transformer 3 changes voltage which is supplied to the primary coil 31 and outputs changed voltage from a secondary coil 32. The secondary side diode D1 for rectifier (rectifier element) rectifies AC voltage which is supplied from the secondary coil 32. An anode of the diode D1 is connected to the secondary coil 32. A cathode of the diode D1 is connected to one end of the condenser C1. The secondary side condenser C1 for smooth (smooth element) smoothes voltage which is rectified by the diode D1. One end of the condenser C1 is connected to the cathode of the diode D1. The other end of the condenser C1 is connected to the ground. Voltage which is smoothed by the condenser C1 is output voltage (+B) of the switching power supply 1. Further, voltage which is smoothed by the condenser C1 is fed back to the control IC 2.

Output voltage from the switching power supply 1 (voltage which is smoothed by the condenser C1) is supplied to a digital amplifier (amplifier). Further, an amplification device is composed of at least the switching power supply 1 and the digital amplifier. Herein, output voltage from the switching power supply 1 (voltage via the diode D2) is supplied to circuits composing the amplification device such as a microcomputer, a network module, a DSP (Digital Signal Processor) and so on other than the digital amplifier.

The shunt regulator 4 is connected to the photo coupler 5 at the secondary side of the switching power supply 1. Further, the shunt regulator 4 changes current which flows to the photo coupler 5 based on output voltage of the switching power supply 1. A reference terminal of the shunt regulator 4 is connected between a resistor R2 and a resistor R3. A cathode of the shunt regulator 4 is connected to the photo coupler 5 (a cathode of a light emitting diode). An anode of the shunt regulator 4 is connected to the ground (ground potential).

The photo coupler 5 has a light emitting diode and a photo transistor. Output voltage of the switching power supply 1 is supplied to an anode of the light emitting diode via a resistor R1. A cathode of the light emitting diode is connected to the shunt regulator 4. A collector of the photo transistor is connected to a feedback terminal FB of the control IC 2. An emitter of the photo transistor is connected to the ground. Output voltage of the switching power supply 1 is supplied to one end of a resistor R4. The other end of the resistance R4 is connected to the shunt regulator 4. The control IC 2 is connected to the photo coupler 5 at the primary side of the switching power supply 1.

In the shunt regulator 4, sink current of the cathode increases or decreases based on divide voltage of output voltage of the switching power supply 1 by the resistor R2 and the resistor R3 which is input to the reference terminal. In the shunt regulator 4, the higher the voltage of the reference terminal is, the more the sink current of cathode increases. Further, in the shunt regulator 4, the lower the voltage of the reference terminal is, the more the sink current of the cathode decreases.

In the photo coupler 5, current of the light emitting diode increases or decreases based on increase or decrease of sink current of the shunt regulator 4. Increase or decrease of current of the photo transistor changes voltage of the feedback terminal FB of the control IC 2. Herein, the power supply is connected to the feedback terminal FB of the control IC 2 via a resistor. For this reason, the more the current of the photo transistor increases, the more the voltage of the feedback terminal FB decreases. The control IC 2 adjusts output voltage of the switching power supply 1 by changing duty of ON/OFF by the switching element based on the voltage of the feedback terminal FB. In other words, the control IC 2 controls the switching element based on a value which is fed back from the secondary side.

The diode D2 is connected between the condenser C1 and the digital amplifier in series. An anode of the diode D2 is connected to the condenser C1. A cathode of the diode D2 is connected to the digital amplifier. In this description and claims, expression of "connected" includes a case where connected via the other element and so on and a case where connected directly without interposing the other element and so on.

One end of the resistor R2 is connected between the condenser C1 and the anode of the diode D2. Herein, divide voltage of output voltage of the switching power supply 1 by the resistor R2 and the resistor R3 is input to the reference terminal of the shunt regulator 4 and is fed back to the control IC 2 via the photo coupler 5. Therefore, voltage which is fed back to the control IC 2 is fetched from between the anode of the diode D2 and the condenser C1. In other words, a feedback route to the control IC 2 is provided at the anode side of the diode D2.

As described above, in the first embodiment, the switching power supply 1 includes the diode D2 connected between the condenser C1 and the digital amplifier in series. The feedback amount of power supply fluctuation by the digital amplifier output can be suppressed by the diode D2. In this manner, gain is not set to small, and the feedback amount from the secondary side to the primary side can be suppressed. For this reason, response characteristics do not deteriorate, and performance of the switching power supply 1 does not deteriorate. Therefore, according to the present embodiment, the feedback amount from the secondary side to the primary side can be suppressed without deteriorating performance of the switching power supply 1.

Further, the feedback amount from the secondary side to the primary side is suppressed. For this reason, information amount of sound and volume feeling of low frequency increase.

Second Embodiment

In the first embodiment, voltage which passes through the diode D2 is supplied to circuits composing the amplification circuit such as the microcomputer, the network module, the DSP and so on other than the digital amplifier. In this case, common impedance occurs to a route to the power supply of the digital amplifier and to a system (the microcomputer, the DSP and so on) other than the digital amplifier. Further, when the digital amplifier is a single end digital amplifier, there is a case where bumping phenomenon that power supply voltage rises occurs. As the first embodiment, when the power supply of the digital amplifier and the power supply of the other circuit are common, risen voltage is applied to the other circuit and destruction and so on may be caused.

Figure 2:
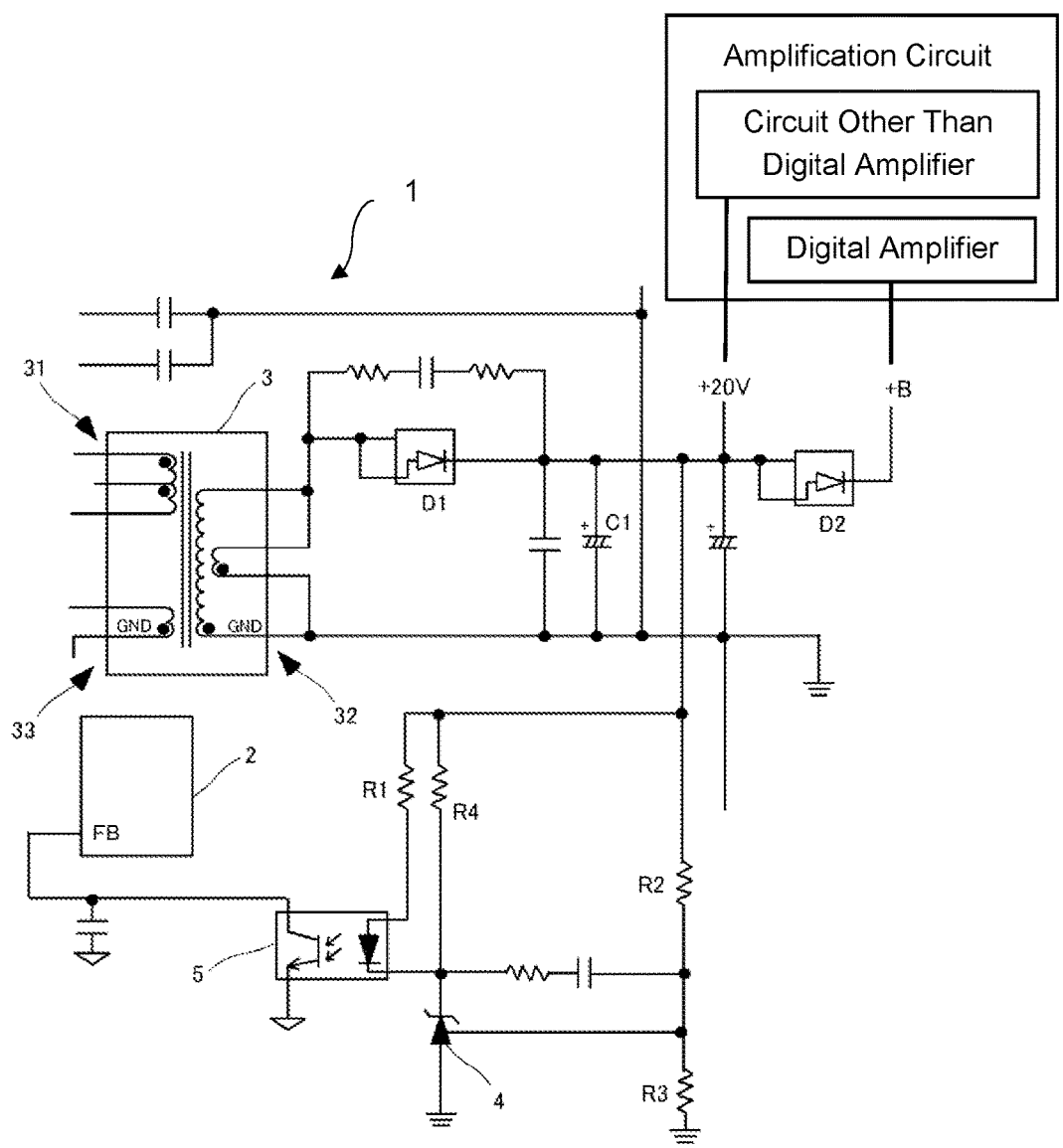
FIG. 2 is a diagram illustrating a circuit constitution of a switching power supply according to a second embodiment of the present disclosure.

For this reason, in a second embodiment, voltage (+20 V of FIG. 2 is a power supply which is supplied to the other circuit) which is supplied to circuits other than the digital amplifier is fetched from between the anode of the diode D2 and the condenser C1. In other words, voltage is supplied from a former stage of the diode D2 to circuits other than the digital amplifier. Further, voltage is supplied from a latter stage of the diode D2 to the digital amplifier. Thus, common impedance does not occur to a route to the power supply of the digital amplifier and to a route to the power supply of system other than the digital amplifier. Further, in the second embodiment, a power supply route to the digital amplifier and a power supply route to system type (circuits other than the digital amplifier) are separate. Thus, bumping phenomenon of the digital amplifier does not affect the other circuits.

Further, in the second embodiment, the voltage which is fed back to the control IC 2 is fetched from between the anode of the diode D2 and the condenser C1. In other words, the voltage of the former stage of the diode D2 is fed back to the control IC 2. Noise occurs because the digital amplifier switches with large amplitude. In the second embodiment, the digital amplifier of the latter stage of the diode D2 is removed from feedback and noise which is occurred by the digital amplifier does not return to the former stage because the voltage of the former stage of the diode D2 is fed back to the control IC 2. For this reason, sound quality improves.

Here, on the sound quality aspect of the digital amplifier, it is better not to apply feedback of the switching power supply 1 strongly. However, fluctuation of power supply voltage by load fluctuation of circuits other than the digital amplifier leads to deterioration of sound quality of the digital amplifier. For this reason, feedback is applied to suppress voltage fluctuation.

For this reason, the diode D2 is connected between the condenser C1 and the digital amplifier in series. Thus, feedback is applied weakly. Further, the voltage which is fed back to the control IC 2 and the voltage which is supplied to circuits other than the digital amplifier are fetched from between the anode of the diode D2 and the condenser C1. In other words, the voltage of the former stage of the diode D2 is fed back to the control IC 2 and is supplied to circuits other than the digital amplifier. Further, the voltage of the latter stage of the diode D2 is supplied to the digital amplifier. Thus, the power supply of the digital amplifier and the power supply of circuits other than the digital amplifier are disconnected by the diode D2 and a feedback route is provided at the anode side of diode D2. For this reason, fluctuation of power supply voltage by load fluctuation of circuits other than the digital amplifier can be fed back.

The embodiments of the present disclosure are described above, but the mode to which the present invention is applicable is not limited to the above embodiments and can be suitably varied without departing from the scope of the present invention.

In the above described first and second embodiments, the switching power supply 1 is a flyback system switching power supply. Not limited to this, a switching power supply that feedback is performed from a secondary side to a primary side such as a feedforward switching power supply may be applied.

The present disclosure can be suitably employed in a switching power supply and an amplification device.

What is claimed is:

1. A switching power supply for an amplification circuit including a digital amplifier and a circuit other than the digital amplifier, the circuit other than the digital amplifier including at least one of a microprocessor, a network module, and a digital signal processor, the switching power supply comprising:
    a control circuit which is provided at a primary side and controls a switching element based on a value which is fed back from a secondary side;
    a transformer;
    a secondary side rectifier element which rectifies voltage which is supplied from the transformer; and
    a secondary side smooth element which smoothes voltage which is rectified by the rectifier element,
    wherein voltage which is smoothed by the smooth element is supplied to the digital amplifier and voltage which is smoothed by the smooth element is fed back to the control circuit,
    further comprising: a diode which includes an anode and a cathode, the anode being connected to the smooth element and the circuit other than the digital amplifier in order to supply voltage to the circuit other than the digital amplifier independent of the diode, and the cathode being connected to the digital amplifier in order to supply voltage to the digital amplifier by way of the diode.

2. The switching power supply according to claim 1, wherein voltage which is fed back to the control circuit is fetched from between the anode of the diode and the smooth element.

3. The switching power supply according to claim 1, wherein voltage which is supplied to the circuit other than the digital amplifier is fetched from between the anode of the diode and the smooth element.

4. An amplification device comprising:
an amplification circuit comprising a digital amplifier and a circuit other than the digital amplifier, the circuit other than the digital amplifier including at least one of a microprocessor, a network module, and a digital signal processor, and
a switching power supply comprising:
    a control circuit which is provided at a primary side and controls a switching element based on a value which is fed back from a secondary side;
    a transformer;
    a secondary side rectifier element which rectifies voltage which is supplied from the transformer; and
    a secondary side smooth element which smoothes voltage which is rectified by the rectifier element,
    wherein voltage which is smoothed by the smooth element is supplied to the digital amplifier and voltage which is smoothed by the smooth element is fed back to the control circuit,
    further comprising: a diode which includes an anode and a cathode, the anode being connected to the smooth element and the circuit other than the digital amplifier in order to supply voltage to the circuit other than the digital amplifier independent of the diode, and the cathode being connected to the digital amplifier in order to supply voltage to the digital amplifier by way of the diode.

* * * * *